United States Patent
Lee et al.

(10) Patent No.: US 9,214,904 B2
(45) Date of Patent: Dec. 15, 2015

(54) DIFFERENTIAL POWER AMPLIFIER USING MODE INJECTION

(75) Inventors: Chang Hyun Lee, Seoul (KR); Chang Kun Park, Gyeonggi-do (KR)

(73) Assignee: SOONGSIL UNIVERSITY RESEARCH CONSORTIUM TECHNO-PARK, Seoul (KR)

( * ) Notice: Subject to any disclaimer, the term of this patent is extended or adjusted under 35 U.S.C. 154(b) by 0 days.

(21) Appl. No.: 14/350,078

(22) PCT Filed: Dec. 23, 2011

(86) PCT No.: PCT/KR2011/010046
§ 371 (c)(1),
(2), (4) Date: Apr. 7, 2014

(87) PCT Pub. No.: WO2013/051763
PCT Pub. Date: Apr. 11, 2013

(65) Prior Publication Data
US 2014/0253234 A1    Sep. 11, 2014

(30) Foreign Application Priority Data

Oct. 7, 2011  (KR) .................. 10-2011-0102572

(51) Int. Cl.
| H03F 3/21 | (2006.01) |
| H03F 3/193 | (2006.01) |
| H03F 1/22 | (2006.01) |
| H03F 3/195 | (2006.01) |
| H03F 3/24 | (2006.01) |
| H03F 3/45 | (2006.01) |

(52) U.S. Cl.
CPC .................. *H03F 3/21* (2013.01); *H03F 1/223* (2013.01); *H03F 3/193* (2013.01); *H03F 3/195* (2013.01); *H03F 3/211* (2013.01); *H03F 3/245* (2013.01); *H03F 3/4508* (2013.01); *H03F 3/45179* (2013.01); *H03F 2003/45008* (2013.01); *H03F 2200/451* (2013.01); *H03F 2203/45318* (2013.01); *H03F 2203/45364* (2013.01); *H03F 2203/45394* (2013.01); *H03F 2203/45562* (2013.01); *H03F 2203/45638* (2013.01); *H03F 2203/45644* (2013.01)

(58) Field of Classification Search
USPC ........................................ 330/252–261, 311
See application file for complete search history.

(56) References Cited

U.S. PATENT DOCUMENTS

| 7,944,298 B2 * | 5/2011 | Cabanillas et al. ........... 330/253 |
| 2008/0242253 A1 | 10/2008 | Yamaji |

FOREIGN PATENT DOCUMENTS

| JP | 2008-252816 A | 10/2008 |
| KR | 10-2009-0115994 A | 11/2009 |
| KR | 10-2011-0064231 A | 6/2011 |
| KR | 10-2011-0102629 A | 9/2011 |

* cited by examiner

*Primary Examiner* — Hieu Nguyen
(74) *Attorney, Agent, or Firm* — Revolution IP, PLLC

(57) ABSTRACT

Disclosed is a differential power amplifier using mode injection, which includes: a first transistor of which the gate receives a first signal and the source is connected to the ground; a second transistor of which the gate receives a second signal and the source is connected to the ground; a third transistor of which the source is connected to the source of the first transistor; a fourth transistor of which the source is connected to the source of the second transistor; a fifth transistor of which the source is connected with the drain of the first transistor and the drain is connected with a first output port and the drain of the third transistor; and a sixth transistor of which the source is connected with the drain of the second transistor and the drain is connected with a second output port and the drain of the fourth transistor.

10 Claims, 7 Drawing Sheets

(a)

(b)

(a)

(b)

DIFFERENTIAL POWER AMPLIFIER USING MODE INJECTION

CROSS REFERENCE TO PRIOR APPLICATIONS

This application is a National Stage Application of PCT International Patent Application No. PCT/KR2011/010046 filed on Dec. 23, 2011, under 35 U.S.C. §371, which claims priority to Korean Patent Application No. 10-2011-0102572 filed on Oct. 7, 2011, which are all hereby incorporated by reference in their entirety.

TECHNICAL FIELD

The present invention relates to a differential power amplifier using mode injection, and more particularly, to a differential power amplifier using mode injection which can prevent oscillation of an amplifier for mode injection.

BACKGROUND ART

In general, a differential power amplifier is an amplifier that generates output in response to signals differentially inputted two input terminals and there are various differential power amplifiers.

FIG. 1 is an exemplary diagram of a differential amplifier according to the related art. The differential amplifier includes two transistors of a first transistor 1 and a second transistor 2.

A first signal is $RF_{IN}+$ inputted to the gate of the first transistor 1 and a second signal $RF_{IN}-$ is inputted to the gate of the second transistor 2. The first signal and the second signal have opposite phases because it is a differential configuration. Accordingly, a third signal $RF_{OUT}+$ outputted to a first output port 3 connected to the drain of the first transistor 1 and a fourth signal $RF_{OUT}-$ outputted to a second output port 4 connected to the drain of the second transistor 2 also have opposite phases.

When the signals inputted to the gates of the transistors are outputted through the drains, the phases are inverted and the magnitudes are amplified. Accordingly, in the third signal, the phase is opposite to that of the first signal inputted to the first transistor 1 and the magnitude is amplified further than that of the first signal. Accordingly, in the fourth signal, the phase is opposite to that of the second signal inputted to the second transistor 2 and the magnitude is amplified further than that of the second signal.

FIG. 2 is an exemplary diagram of a differential amplifier where mode injection is applied in FIG. 1. The configuration illustrated in FIG. 2 is obtained by applying mode injection to the configuration of the differential amplifier of FIG. 1. The power amplifier using mode injection illustrated in FIG. 2 additionally include a third transistor 5 and a fourth transistor 6 in comparison to the configuration illustrated in FIG. 1.

The drain of the third transistor 5 is connected with the drain of the first transistor 1 and the source of the third transistor 5 is connected with the source of the first transistor 1. The gate of the third transistor 5 is connected with the drain of the second transistor 2, so the signal outputted to the drain of the second transistor 2 is the input of the third transistor 5.

Similarly, the drain of the fourth transistor 6 is connected with the drain of the second transistor 2 and the source of the fourth transistor 6 is connected with the source of the second transistor 2. The gate of the fourth transistor 6 is connected with the drain of the first transistor 1, so the signal outputted to the drain of the first transistor 1 is the input of the fourth transistor 6.

As a result, in the power amplifier illustrated in FIG. 2, the first signal $RF_{IN}+$ and the second signal $RF_{IN}-$ are the input and the fifth signal $RF_{OUT}+$ and the sixth signal $RF_{OUT}-$ are the output. The components substantially in charge of amplifying are, similar to the configuration illustrated in FIG. 1, the first transistor 1 and the second transistor 2, and the third transistor 5 and the fourth transistor 6 are added for the amplification. Accordingly, the fifth signal $RF_{OUT}+$ and the sixth signal $RF_{OUT}-$ can have magnitudes amplified further than the third signal and the fourth signal in the configuration illustrated in FIG. 1.

That is, the gates of the third transistor 5 and the fourth transistor 6 which are input are connected with the drains of the second transistor 2 and the first transistor 1, respectively. Accordingly, the signals activating the third transistor 5 and the fourth transistor 6 are not the first signal $RF_{IN}+$ and the second signal $RF_{IN}-$, but nodes in the amplifier (the drain of the second transistor 2 and the drain of the first transistor 1).

Accordingly, when mode injection is provided to a power amplifier, as in FIG. 2, since there are transistors that provide additional amplification such as the third transistor 5 and the fourth transistor 6 even if the magnitudes of the input first signal $RF_{IN}+$ and second signal $RF_{IN}-$ are not increased, the amplifier has higher gain than that of the amplifier illustrated in FIG. 1.

The largest advantage of the amplifier using mode injection according to the related art is to be able to improve the gain. In contrast, the large problem is high possibility of oscillation due to positive feedback by the additional transistors 5 and 6 for mode injection. That is, there is a problem in that a fifth signal or a sixth signal is outputted, even though a first signal or a second signal is not inputted.

The problem is described hereafter with reference to FIG. 2. Even though the first signal $RF_{IN}+$ and the second signal $RF_{IN}-$ are not applied to the transistors 1 and 2, respectively, the third transistor 5 receives a signal from the drain of the second transistor 6 and the signal is amplified at the drain of the third transistor 5. The amplified signal is inputted to the gate of the fourth transistor 6 and amplified again at the drain of the fourth transistor 6, and then the amplified signal is applied to the gate of the third transistor 5 and amplified at the drain of the third transistor 5 repeatedly. Accordingly, the amplifier using mode injection in FIG. 2 causes amplification itself even if first signal $RF_{IN}+$ and the second signal $RF_{IN}-$ are not inputted from the outside, which is generally called oscillation. It means that the output of an amplifier does not amplify an input signal, but the amplifier is likely to operate itself.

Accordingly, it is not preferable to apply an amplifier using mode injection which has those characteristics to a specific wireless communication system. In the related art, a large transistor that functions as a switch was additionally disposed at a VDD or GND node in order to solve the problem. The additional transistor does not apply a first signal $RF_{IN}+$ and a second signal $RF_{IN}-$ and disconnect the VDD or GND node from the amplifier, when the amplifier needs to be turned off in a wireless communication system. This allows for control of an output signal as an input signal, so the problem described above can be solved a little, but there is a defect that a transistor is additionally used. Further, the transistor that functions as a switch requires a large gate width in comparison to the transistors for amplifiers in order to minimize the ohmic loss. Accordingly, the additional transistor occupies a large area in an integrated circuit, and accordingly, the manufacturing cost of the integrated circuit increases.

DISCLOSURE

Technical Problem

An object of the present invention is to provide a differential power amplifier using mode injection which has no possibility of oscillation by an amplifier and does not need an addition specific transistor for the function of a switch, by enabling a main power amplifier to control a mode injection type power amplifier.

Technical Solution

An embodiment of the present invention provides a differential power amplifier using mode injection, which includes: a first transistor of which the gate receives a first signal and the source is connected to the ground; a second transistor of which the gate receives a second signal having a phase opposite to the phase of the first signal and the source is connected to the ground; a third transistor of which the source is connected to the source of the first transistor; a fourth transistor of which the source is connected to the source of the second transistor; a fifth transistor of which the source is connected with the drain of the first transistor and the drain is connected with a first output port and the drain of the third transistor; and a sixth transistor of which the source is connected with the drain of the second transistor and the drain is connected with a second output port and the drain of the fourth transistor, in which the gate of the third transistor is connected with the drain of the second transistor and the gate of the fourth transistor is connected with the drain of the first transistor.

The power differential amplifier may further include: a first capacitor connected between the gate of the third transistor and the drain of the second transistor; and a second capacitor connected between the gate of the fourth transistor and the drain of the first transistor.

The drain of the fifth transistor and the drain of the sixth transistor may be connected with an input power.

A signal passing through the first transistor and the fourth transistor may be amplified and outputted to the second output port, and a signal passing through the second transistor and the third transistor may be amplified and outputted to the first output port.

A third signal passing through the first transistor and the fourth transistor and a fourth signal passing through the second transistor and the sixth transistor may be combined and outputted to the second output port, and a fifth signal passing through the second transistor and the third transistor and a sixth signal passing through the first transistor and the fifth transistor may be combined and outputted to the first output port.

The signal applied to the gate of the third transistor may have an opposite phase and an amplified magnitude in comparison to the signal applied to the gate of the second transistor, and the signal applied to the gate of the fourth transistor may have an opposite phase and an amplified magnitude in comparison to the signal applied to the gate of the first transistor.

Another embodiment of the present invention provides a differential power amplifier using mode injection, which includes: a first transistor of which the gate receives a first signal and the source is connected to the ground; a second transistor of which the gate receives a second signal having a phase opposite to the phase of the first signal and the source is connected to the ground; a third transistor of which the source is connected to the source of the first transistor; a fourth transistor of which the source is connected to the source of the second transistor; a fifth transistor of which the source is connected with the drain of the first transistor and the drain is connected with a first output port; a sixth transistor of which the source is connected with the drain of the second transistor and the drain is connected with a second output port; a seventh transistor of which the source is connected with the drain of the third transistor and the drain is connected with the drain of the fifth transistor; and an eight transistor of which the source is connected with the drain of the fourth transistor and the drain is connected with the drain of the sixth transistor, in which the gate of the third transistor is connected with the drain of the second transistor and the gate of the fourth transistor is connected with the drain of the first transistor.

The power differential amplifier may further include: a first capacitor connected between the gate of the third transistor and the drain of the second transistor; and a second capacitor connected between the gate of the fourth transistor and the drain of the first transistor.

The drain of the fifth transistor and the drain of the sixth transistor may be connected with an input power.

A signal passing through the first transistor and the fourth transistor may be amplified and outputted to the second output port, and a signal passing through the second transistor and the third transistor may be amplified and outputted to the first output port.

A seventh signal passing through the first transistor, the fourth transistor, and the eighth transistor may have a magnitude larger than that of an eighth signal passing through the second transistor and the sixth transistor, and a ninth signal passing through the second transistor, the third transistor and the seventh transistor may have a magnitude larger than that of a tenth signal passing through the first transistor and the fifth transistor.

The seventh signal and the eighth signal may be combined and outputted to the second output port and the ninth signal and the tenth signal may be combined and outputted to the first output port.

The signal applied to the gate of the third transistor may have an opposite phase and an amplified magnitude in comparison to the signal applied to the gate of the second transistor, and the signal applied to the gate of the fourth transistor may have an opposite phase and an amplified magnitude in comparison to the signal applied to the gate of the first transistor.

Advantageous Effects

According to the differential power amplifier using mode injection of the present invention, a mode injection type power amplifier can be controlled by a main power amplifier, such that the possibility of oscillation by an amplifier can be removed and there is no need of a transistor for a switch which is necessary for turning off power amplifiers using mode injection.

BEST MODE

Figure 1:
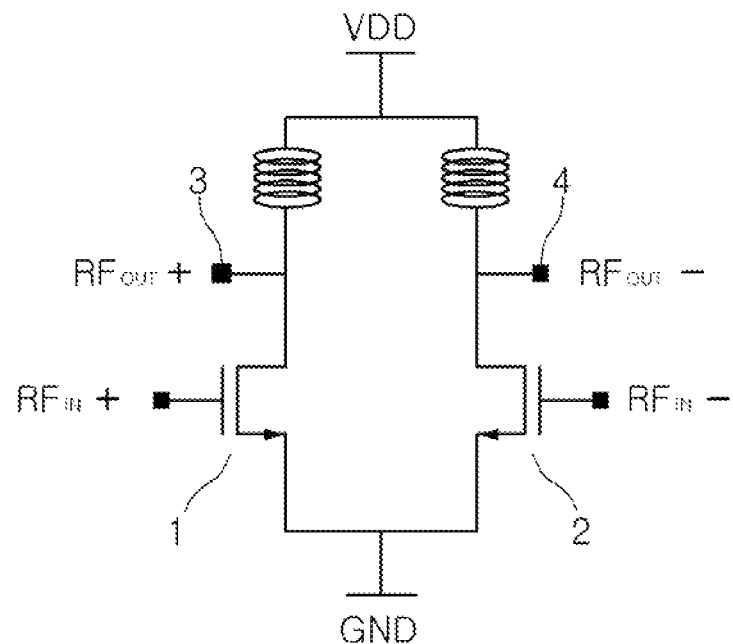
FIG. 1 is an exemplary diagram of a differential amplifier according to the related art.
Figure 2:
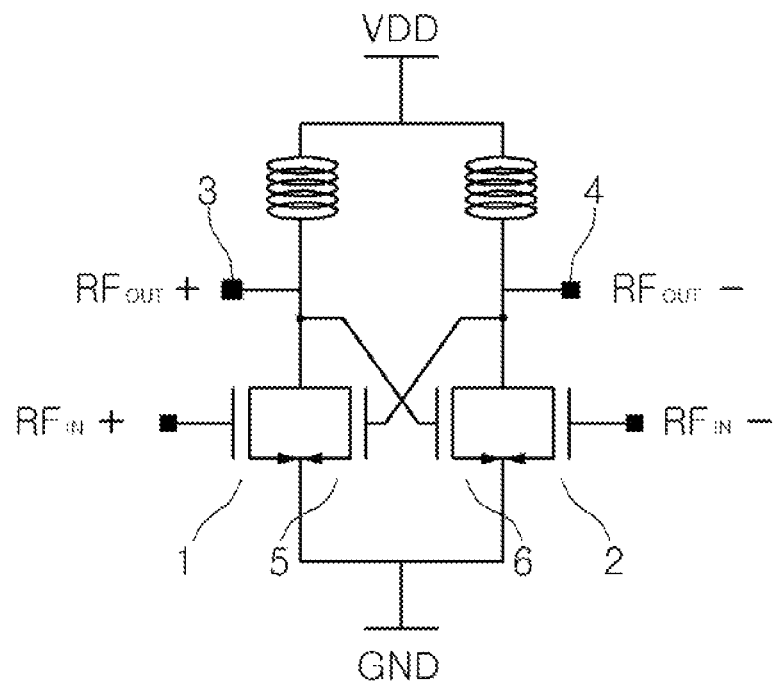
FIG. 2 is an exemplary diagram of a differential amplifier where mode injection is applied in FIG. 1
Figure 3:
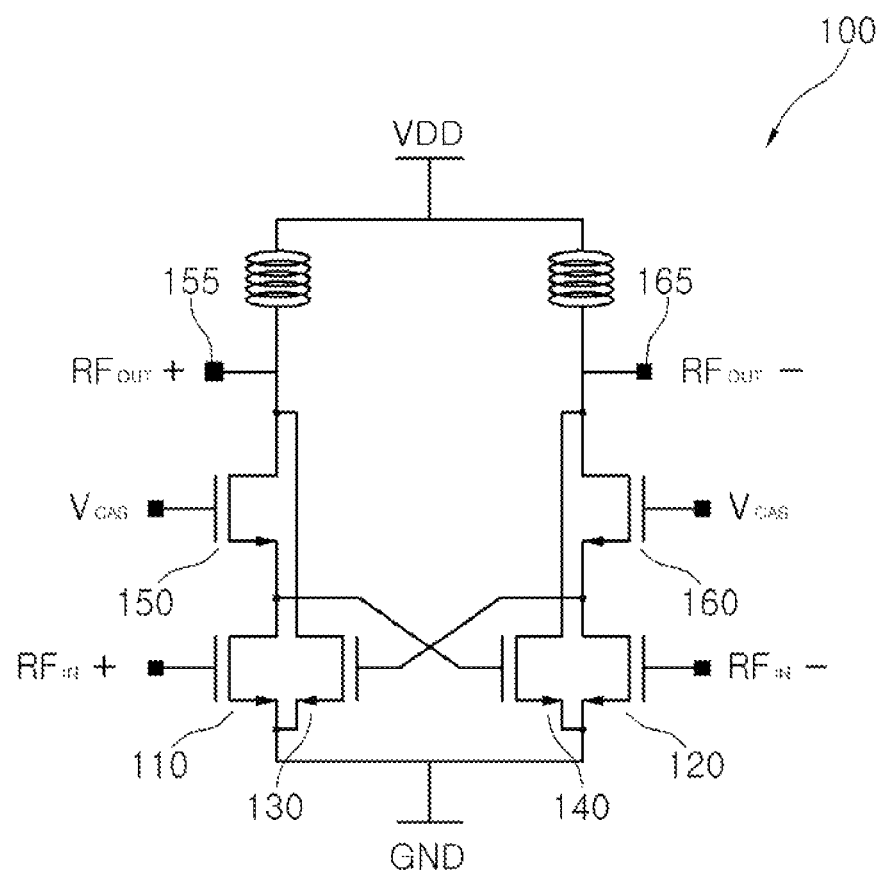
FIG. 3 is a diagram illustrating the configuration of a differential power amplifier using mode injection according to an embodiment of the present invention.

Hereinafter, exemplary embodiment of the present invention will be described in detail with reference to the accompanying drawings for those skilled in the related art to be able to easily accomplish the present invention. FIG. 3 is a diagram illustrating the configuration of a differential power amplifier using mode injection according to an embodiment of the present invention.

The differential power amplifier 100 using mode injection includes first to sixth transistors 110, 120, 130, 140, 150, and 160.

As for the first transistor 110, a first signal $RF_{IN}+$ is inputted to the gate and the source is connected to the ground GND. The first transistor 110 amplifies the inputted first signal with the phase inverted and outputs it through the drain.

As for the second transistor 120, a first signal $RF_{IN}-$ having a phase opposite to the phase of the first signal is inputted to the gate and the source is connected to the ground GND. The second transistor 120 amplifies the inputted second signal with the phase inverted and outputs it through the drain.

As for the third transistor 130, the source is connected with the source of the first transistor 110. The source of the fourth transistor 140 is connected with the source of the second transistor 120.

As for the fifth transistor 150, the source is connected with the drain of the first transistor 110 and the drain of the fifth transistor 150 is connected with a first output port 155 and the drain of the third transistor 130.

As for the sixth transistor 160, similarly, the source is connected with the drain of the second transistor 120 and the drain of the sixth transistor 160 is connected with a second output port 165 and the drain of the fourth transistor 140.

The drain of the fifth transistor 150 and the drain of the sixth transistor 160 are connected with an input power VDD. Further, a predetermined DC voltage $V_{CAS}$ is applied to the gate of the fifth transistor 150 and the gate of the sixth transistor 160.

The gate of the third transistor 130 is connected with the drain of the second transistor 120 and the gate of the fourth transistor 140 is connected with the drain of the first transistor 110.

Accordingly, a signal sequentially passing through the first transistor 110 and the fourth transistor 140 is amplified and outputted to the second output port 165. Similarly, a signal sequentially passing through the second transistor 120 and the third transistor 130 is amplified and outputted to the first output port 155.

The signal applied to the gate of the third transistor 130 is opposite in phase to the signal applied to the gate of the second transistor 120, with the magnitude amplified. Similarly, the signal applied to the gate of the fourth transistor 140 is opposite in phase to the signal applied to the gate of the first transistor 110, with the magnitude amplified.

Accordingly, a 'third signal' sequentially passing through the first transistor 110 and the fourth transistor 140 and a 'fourth signal' sequentially passing through the second transistor 120 and the sixth transistor 160 are combined and outputted to the second output port 165. Further, a 'fifth signal' sequentially passing through the second transistor 120 and the third transistor 130 and a 'sixth signal' sequentially passing through the first transistor 110 and the fifth transistor 150 are combined and outputted to the first output port 155.

Figure 4:
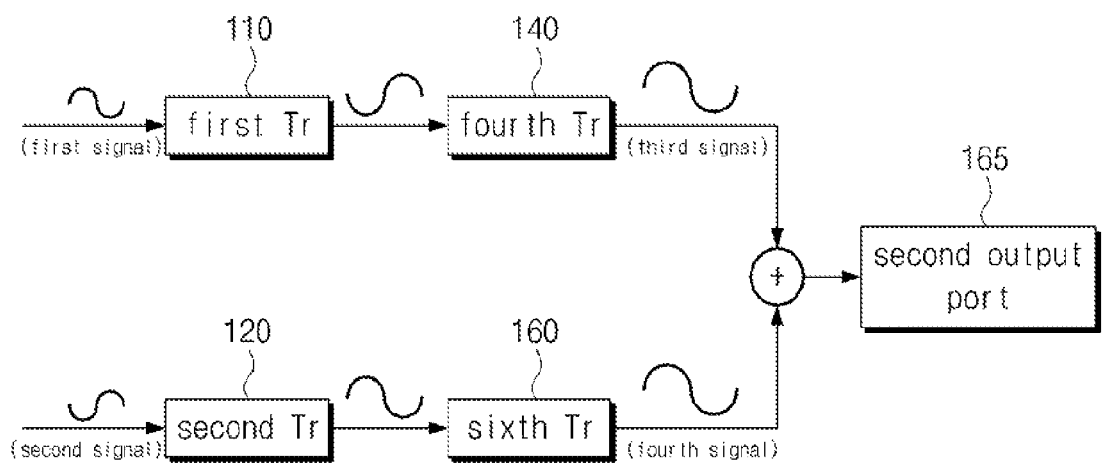
FIG. 4 is a conceptual diagram of signals outputted to the first output port and the second output port illustrated in FIG. 3.
Figure 4:
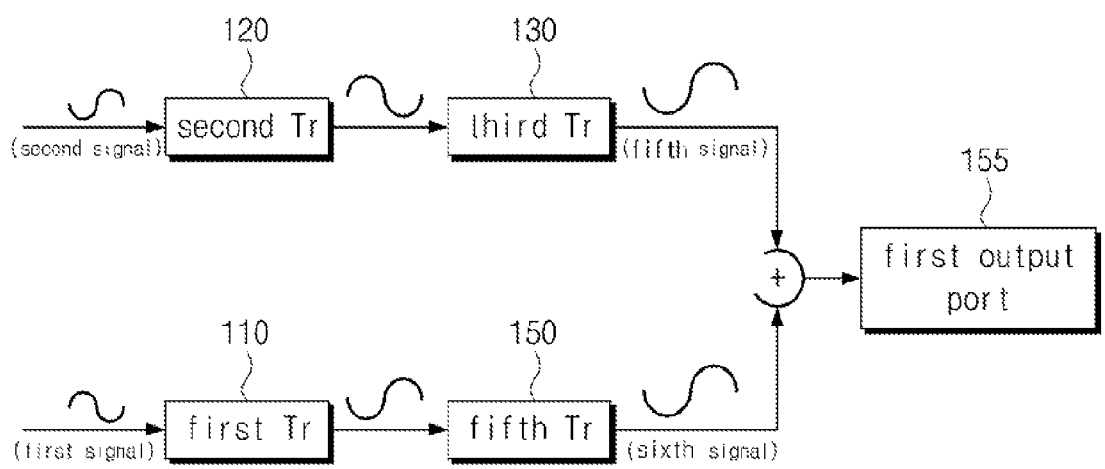

The transmission process of signals is described hereafter with reference to FIG. 4. FIG. 4 is a conceptual diagram of signals outputted to the first output port and the second output port illustrated in FIG. 3.

First, (a) of FIG. 4 illustrates signals traveling through two paths outputted to the second output port 165. The 'third signal' and the 'fourth signal' passing through the paths, respectively, are outputted with the magnitudes combined to the second output port 165.

As for the first path, the first signal $RF_{IN}+$ inputted through the gate of the first transistor 110 is amplified with the phase inverted and outputted to the drain of the first transistor 110, inputted to the gate of the fourth transistor 140, and then amplified with the phase inverted and outputted as the third signal through the drain of the fourth transistor 140. Accordingly, the third signal is a signal inverted in phase two times and amplified two times after the first signal.

As for the second path, the second signal $RF_{IN}-$ inputted through the gate of the second transistor 120 is amplified with the phase inverted and outputted to the drain of the second transistor 120, inputted to the source of the sixth transistor 160, and then amplified and outputted as the fourth signal through the drain of the sixth transistor 160. Accordingly, the fourth signal is a signal inverted in phase one time and amplified two times after the second signal.

Therefore, the third signal and the fourth signal have the same phases the signal $RF_{OUT}-$ with the sum of the magnitudes of the two signals is outputted through the second output port 165.

(b) of FIG. 4 illustrates signals traveling through two paths outputted to the first output port 155. A fifth signal and a sixth signal passing through the paths, respectively, are outputted with the magnitudes combined through the first output port 155. The characteristics of the signals passing through the transistors on the paths are the same as those in (a) of FIG. 4 and the detailed description is not provided.

As described above, according to the configuration of the present invention illustrated in FIG. 3, it is possible to increase the entire gain of the amplifier because all of the transistors contribute to amplifying.

When the first signal $RF_{IN}+$ and the second signal $RF_{IN}-$ that are the input of the first transistor 110 and the second transistor 120 are not applied, the first transistor 110 and the second transistor 120 does not amplify a signal such that the AC signal is removed at the drain nodes of the first transistor 110 and the second transistor 120. That is, since an AC signal is not generated at the drain nodes of the first transistor 110 and the second transistor 120, the fourth transistor 140 and the third transistor 130 using the drain nodes as the AC input can also not amplify a signal.

Accordingly, although there was a problem of oscillation due to amplification by the transistors for mode injection even through there is no input in the amplifier where mode injection is applied of the related art, there is no problem of oscillation in the power amplifier using mode injection. Therefore, the amplifier of the present invention, unlike the related art, is automatically turned off when there is no input signal in the amplifier, such that there is no need of a specific transistor that functions as a switch for turning off an amplifier.

Figure 5:
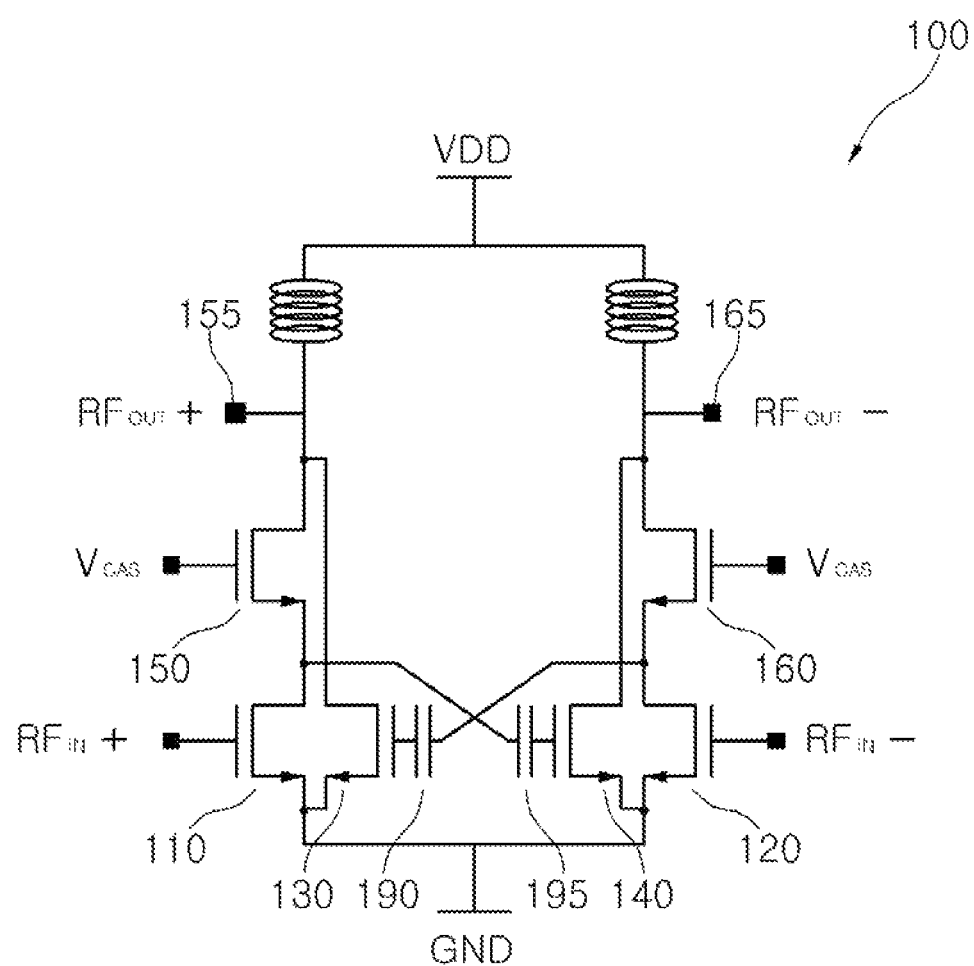
FIG. 5 is a diagram illustrating a configuration with a capacitor added to the configuration illustrated in FIG. 3.

FIG. 5 is a diagram illustrating a configuration with a capacitor added to the configuration illustrated in FIG. 3. That is, a first capacitor 190 is connected between the gate of the third transistor 130 and the drain of the second transistor 120. That is, a second capacitor 195 is connected between the gate of the fourth transistor 140 and the drain of the first transistor 110.

The capacitors 190 and 195 separates (blocks) the DC components between the gate of the third transistor 130 (or the gate of the fourth transistor 140) and the drain of the second transistor 120 (or the drain of the first transistor 110). Accordingly, an optimized bias voltage can be applied to the gates of the third transistor 130 and the fourth transistor 140. Therefore, with the addition of the capacitors 190 and 195 for DC-blocking, the optimized bias voltage is applied to the transistors 130 and 140 for mode injection, such that the performance of the amplifier can be optimized.

Figure 6:
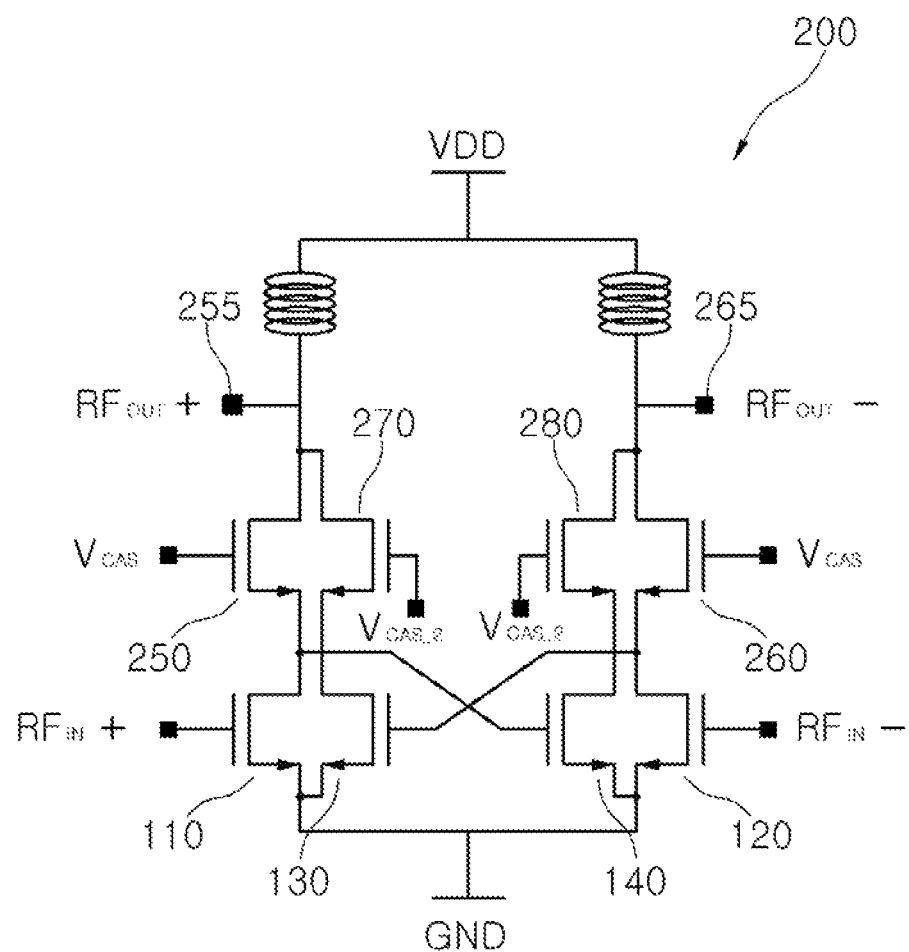
FIG. 6 is a diagram illustrating the configuration of a differential power amplifier using mode injection according to another embodiment of the present invention.

FIG. 6 is a diagram illustrating the configuration of a differential power amplifier using mode injection according to another embodiment of the present invention. The differential power amplifier 200 according to another embodiment includes first to eighth transistors 110, 120, 130, 140, 250, 260, 270, and 280.

The first to fourth transistors 110, 120, 130, and 140 are the same in configuration and operation as those of the embodiment illustrated in FIG. 3 and the detailed description is not provided.

As for the fifth transistor 250, the source is connected with the drain of the first transistor 110 and the drain is connected with a first output port 255. As for the sixth transistor 260, similarly, the source is connected with the drain of the second transistor 120 and the drain is connected with a second output port 265.

The drain of the fifth transistor 250 and the drain of the sixth transistor 260 are connected with an input power VDD. Further, a predetermined DC voltage $V_{CAS}$ is applied to the gate of the fifth transistor 250 and the gate of the sixth transistor 260.

As for the seventh transistor 270, the source is connected with the drain of the third transistor 130 and the drain of the seventh transistor 270 is connected with the drain of the fifth transistor 250. Further, as for the eighth transistor 280, the source is connected with the drain of the fourth transistor 140 and the drain of the eighth transistor 280 is connected with the drain of the sixth transistor 260. A predetermined DC voltage $V_{CAS\_2}$ is also applied to the gate of the seventh transistor 270 and the gate of the eighth transistor 280.

Similar to the previous embodiment, the gate of the third transistor 130 is connected with the drain of the second transistor 120 and the gate of the fourth transistor 140 is connected with the drain of the first transistor 110.

Accordingly, a signal sequentially passing through the first transistor 110 and the fourth transistor 140 is amplified and then outputted to the second output port 265. Similarly, a signal sequentially passing through the second transistor 120 and the third transistor 130 is amplified and then outputted to the first output port 255. Further, the signal applied to the gate of the third transistor 130 has an opposite phase and an amplified magnitude in comparison to the signal applied to the gate of the second transistor 120, and the signal applied to the gate of the fourth transistor 140 has an opposite phase and an amplified magnitude in comparison to the signal applied to the gate of the first transistor 110.

Generally describing the configuration, a 'seventh signal' sequentially passing through the first transistor 110, the fourth transistor 140, and the eighth transistor 280 and an 'eighth signal' sequentially passing through the second transistor 120 and the sixth transistor 260 are combined and outputted to the second output port 265. Similarly, a 'ninth signal' sequentially passing through the second transistor 120, the third transistor 130, and the seventh transistor 270 and a 'tenth signal' sequentially passing through the first transistor 110 and the fifth transistor 250 are combined and outputted to the first output port 255.

Figure 7:
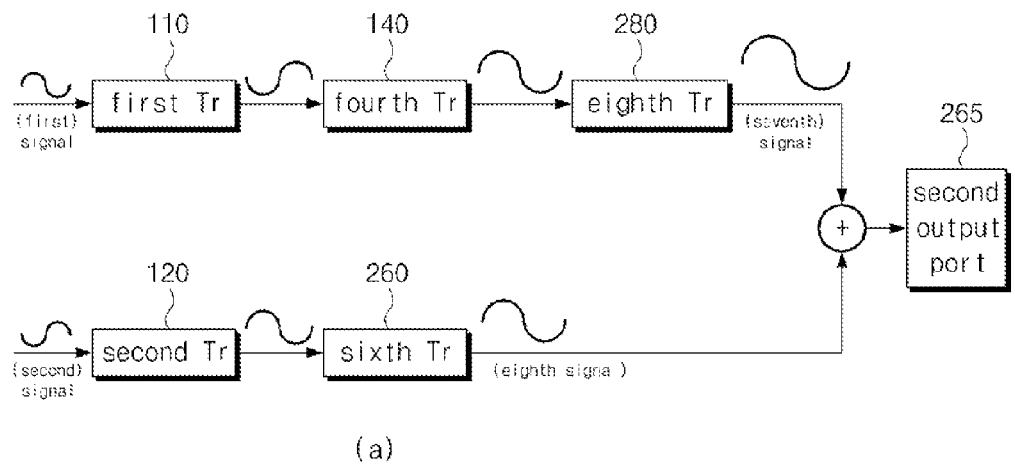
FIG. 7 is a conceptual diagram of signals outputted to the first output port and the second output port illustrated in FIG. 6.
Figure 7:
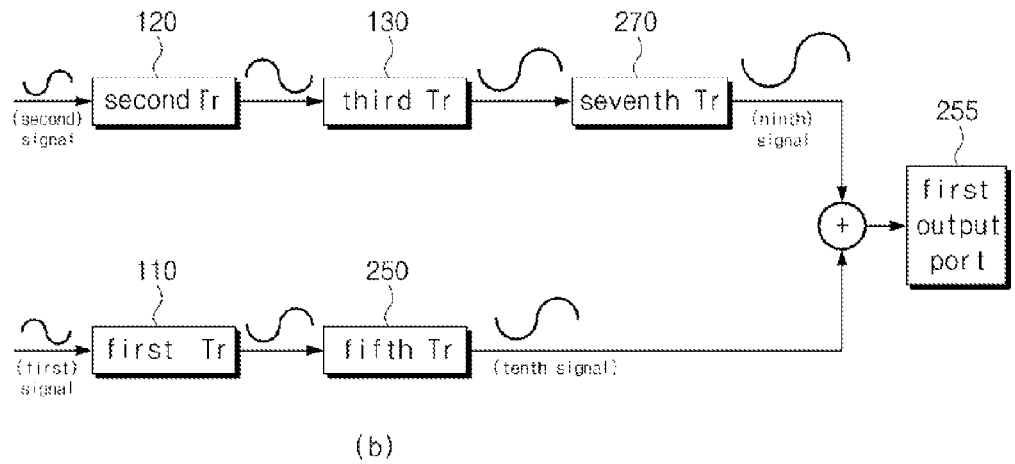

The transmission process of signals is described hereafter with reference to FIG. 7. FIG. 7 is a conceptual diagram of signals outputted to the first output port and the second output port illustrated in FIG. 6.

First, (a) of FIG. 7 illustrates signals traveling through two paths outputted to the second output port 265. The 'seventh signal' and the 'eighth signal' passing through the paths, respectively, are outputted with the magnitudes combined to the second output port 265.

As for the first path, the first signal $RF_{IN}+$ inputted through the gate of the first transistor 110 is amplified with the phase inverted and outputted to the drain of the first transistor 110, inputted to the gate of the fourth transistor 140, and then amplified with the phase inverted and outputted through the drain of the fourth transistor 140. The signal is inputted to the source of the eighth transistor 280, amplified, and then outputted as a seventh signal through the drain of the eighth transistor 280. Accordingly, the seventh signal is a signal inverted in phase two times and amplified three times after the first signal.

As for the second path, the second signal $RF_{IN}-$ inputted through the gate of the second transistor 120 is amplified with the phase inverted and outputted to the drain of the second transistor 120, inputted to the source of the sixth transistor 260, and then amplified and outputted as the eighth signal through the drain of the sixth transistor 260. Accordingly, the eighth signal is a signal inverted in phase one time and amplified two times after the second signal.

Therefore, the seventh signal and the eighth signal have the same phases the signal $RF_{OUT}-$ with the sum of the magnitudes of the two signals is outputted through the second output port 265. However, the seventh signal amplified three times through its path has a larger magnitude than the eighth signal amplified two times.

(b) of FIG. 7 illustrates signals traveling through two paths outputted to the first output port 255. A ninth signal and a tenth signal passing through the paths, respectively, are outputted with the magnitudes combined through the first output port 255. The characteristics of the signals passing through the transistors on the paths are the same as those in (a) of FIG. 7 and the detailed description is not provided. However, in (b) of FIG. 7, the ninth signal amplified three times through its path has a larger magnitude than the tenth signal amplified two times.

As described above, according to the configuration of another embodiment of the present invention illustrated in FIG. 6, since all of the transistors contribute to amplifying, the gain of the entire amplifier can be increased, but, similar to the previous embodiment, when the first signal $RF_{IN}+$ and the second signal $RF_{IN}-$ are not applied, the first transistor 110 and the second transistor 120 does not perform amplifying, such that the AC signal is removed at the drain nodes of the first transistor 110 and the second transistor 120 and there is no oscillation due to the third and fourth transistors 130 and 140.

The fifth transistor 250 and the sixth transistor 260 provide the gate bias voltage of the seventh transistor 270 and the eight transistor 280 that are the cascode transistors of the third transistor 130 and the fourth transistor 140 for mode injection and it is possible to adjust the parasitic capacitance of a transistor and channel resistance of the seventh transistor 270 and the eight transistor 280 by adjusting the voltage of $V_{CAS}$ and $V_{CAS\_2}$, such that the performance of the amplifier can be optimized.

Figure 8:
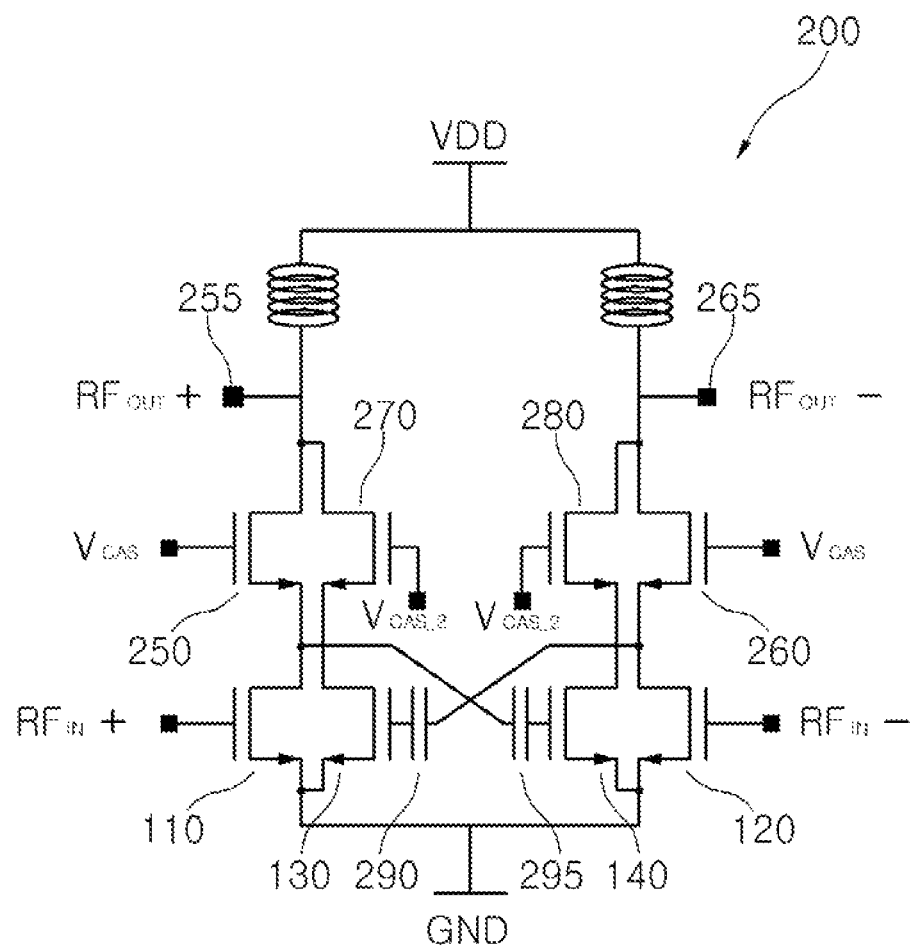
FIG. 8 is a diagram illustrating a configuration with a capacitor added to the configuration illustrated in FIG. 6.

FIG. 8 is a diagram illustrating a configuration with a capacitor added to the configuration illustrated in FIG. 6. That is, a first capacitor 290 is connected between the gate of the third transistor 130 and the drain of the second transistor 120. That is, a second capacitor 295 is connected between the gate of the fourth transistor 140 and the drain of the first transistor 110. The effect of the transistors is the same as that in the previous embodiment and the detailed description is not provided.

According to the differential power amplifier using mode injection of the present invention, a mode injection type power amplifier can be controlled by a main power amplifier, such that the possibility of oscillation by an amplifier can be removed and there is no need of a transistor for a switch which is necessary for turning off power amplifiers using mode injection.

Although the present invention has been described with reference to the embodiments illustrated in the drawings, those are only examples and may be changed and modified into other equivalent embodiments from the present invention by those skilled in the art. Therefore, the technical protective region of the present invention should be determined by the scope described in claims.

The invention claimed is:

1. A differential power amplifier using mode injection, comprising:
    a gate of a first transistor receives a first signal and a source of the first transistor connected to a ground;
    a gate of a second transistor receives a second signal having a phase opposite to the phase of the first signal and a source of the second transistor connected to the ground;
    a source of a third transistor connected to the source of the first transistor;
    a source of a fourth transistor connected to the source of the second transistor;
    a source of a fifth transistor connected with a drain of the first transistor and a drain of the fifth transistor connected with a first output port and a drain of the third transistor; and
    a source of a sixth transistor connected with a drain of the second transistor, and a drain of the sixth transistor connected with a second output port and a drain of the fourth transistor, wherein
    the gate of the third transistor is connected with the drain of the second transistor and a gate of the fourth transistor is connected with the drain of the first transistor, and
    wherein phases of signals passing through the first transistor and the fifth transistor is the same that corresponding to the first output port, and
    phases of signals passing through the second transistor and the sixth transistor are the same that corresponding to the second output port,
    wherein a third signal passing through the first transistor and the fourth transistor and a fourth signal passing through the second transistor and the sixth transistor are combined and outputted to the second output port, and
    a fifth signal passing through the second transistor and the third transistor and a sixth signal passing through the first transistor and the fifth transistor are combined and outputted to the first output port.

2. The differential power amplifier of claim 1, further comprising:
    a first capacitor connected between the gate of the third transistor and the drain of the second transistor; and a second capacitor connected between the gate of the fourth transistor and the drain of the first transistor.

3. The differential power amplifier of claim 1, wherein a drain of the fifth transistor and a drain of the sixth transistor are connected with an input power.

4. The differential power amplifier of claim 1, wherein a signal passing through the first transistor and the fourth transistor is amplified and outputted to the second output port, and a signal passing through the second transistor and the third transistor is amplified and outputted to the first output port.

5. The differential power amplifier of claim 1, wherein a signal applied to the gate of the third transistor has an opposite phase and an amplified magnitude in comparison to a signal applied to the gate of the second transistor, and
    a signal applied to the gate of the fourth transistor has an opposite phase and an amplified magnitude in comparison to a signal applied to the gate of the first transistor.

6. A differential power amplifier using mode injection, comprising:
    a gate of a first transistor receives a first signal and a source of the first transistor connected to a ground;
    a gate of a second transistor receives a second signal having a phase opposite to the phase of the first signal and a source of the second transistor is connected to the ground;
    a source of a third transistor connected to the source of the first transistor;
    a source of a fourth transistor connected to the source of the second transistor;
    a source of a fifth transistor connected with a drain of the first transistor and the drain of the fifth transistor connected with a first output port;
    a source of a sixth transistor connected with a drain of the second transistor and the drain of the sixth transistor connected with a second output port;
    a source of a seventh transistor connected with a drain of the third transistor and the drain of the seventh transistor connected with a drain of the fifth transistor; and
    a source of an eighth transistor connected with a drain of the fourth transistor and the drain of the eighth transistor connected with a drain of the sixth transistor,
    wherein a gate of the third transistor is connected with the drain of the second transistor and a gate of the fourth transistor is connected with the drain of the first transistor, and
    wherein phases of signals passing through the third transistor and the seventh transistor is the same that corresponding to the first output port, and
    phases of signals passing through the fourth transistor and the eighth transistor are the same that corresponding to the second output port,
    wherein a seventh signal passing through the first transistor, the fourth transistor, and the eighth transistor has a magnitude larger than that of an eighth signal passing through the second transistor and the sixth transistor, and a ninth signal passing through the second transistor, the third transistor and the seventh transistor has a magnitude larger than that of a tenth signal passing through the first transistor and the fifth transistor,
    wherein the seventh signal and the eighth signal are combined and outputted to the second output port, and the ninth signal and the tenth signal are combined and outputted to the first output port.

7. The power differential amplifier of claim 6, further comprising:
a first capacitor connected between the gate of the third transistor and the drain of the second transistor; and a second capacitor connected between the gate of the fourth transistor and the drain of the first transistor.

8. The differential power amplifier of claim 6, wherein the drain of the fifth transistor and the drain of the sixth transistor are connected with an input power.

9. The differential power amplifier of claim 6, wherein a signal passing through the first transistor and the fourth transistor is amplified and outputted to the second output port, and a signal passing through the second transistor and the third transistor is amplified and outputted to the first output port.

10. The differential power amplifier of claim 6, wherein a signal applied to the gate of the third transistor has an opposite phase and an amplified magnitude in comparison to the signal applied to the gate of the second transistor, and a signal applied to the gate of the fourth transistor has an opposite phase and an amplified magnitude in comparison to the signal applied to the gate of the first transistor.

* * * * *